(12) United States Patent
Cinar et al.

(10) Patent No.: US 10,955,882 B2
(45) Date of Patent: Mar. 23, 2021

(54) SOLID-STATE DRIVE CASE AND SOLID-STATE DRIVE DEVICE USING THE SAME

(71) Applicant: Samsung Electronics Co., Ltd., Suwon-si (KR)

(72) Inventors: Yusuf Cinar, Yongin-si (KR); Jae Hong Park, Suwon-si (KR); Han Hong Lee, Suwon-si (KR); Jung Hoon Kim, Suwon-si (KR); Ki Taek Lee, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 168 days.

(21) Appl. No.: 16/057,049

(22) Filed: Aug. 7, 2018

(65) Prior Publication Data

US 2019/0278343 A1 Sep. 12, 2019

(30) Foreign Application Priority Data

Mar. 9, 2018 (KR) ........................ 10-2018-0027963

(51) Int. Cl.
*G06F 1/20* (2006.01)
*G06F 1/18* (2006.01)
*H05K 7/20* (2006.01)

(52) U.S. Cl.
CPC ............... *G06F 1/20* (2013.01); *G06F 1/182* (2013.01); *H05K 7/20* (2013.01)

(58) Field of Classification Search
CPC .............. G06F 1/20; G06F 1/182; H05K 7/20

USPC .......................................... 361/707
See application file for complete search history.

(56) References Cited

U.S. PATENT DOCUMENTS

| | | | |
|---|---|---|---|
| 8,665,601 B1 | 3/2014 | Mangay-Ayam, Jr. et al. | |
| 8,879,263 B2 | 11/2014 | Gunderson | |
| 9,603,280 B2 | 3/2017 | Frank et al. | |
| 9,607,914 B2 | 3/2017 | Gwin | |
| 9,807,899 B2 | 10/2017 | Matsuda et al. | |
| 2008/0212297 A1* | 9/2008 | Ni .................. | G06F 12/1416 361/760 |
| 2012/0281364 A1* | 11/2012 | Gunderson .......... | H05K 5/0256 361/714 |
| 2016/0270261 A1 | 9/2016 | Matsuda et al. | |
| 2017/0185117 A1 | 6/2017 | Szeremeta et al. | |
| 2018/0042139 A1* | 2/2018 | Rosales .............. | H01L 23/3735 |
| 2018/0203490 A1* | 7/2018 | Kim ................... | G06F 1/20 |
| 2018/0316837 A1* | 11/2018 | Ishida ................. | H01M 10/613 |

* cited by examiner

*Primary Examiner* — Anatoly Vortman
*Assistant Examiner* — Zhengfu J Feng
(74) *Attorney, Agent, or Firm* — Harness, Dickey & Pierce, P.L.C.

(57) ABSTRACT

A solid-state drive device includes a memory module in which at least one non-volatile memory device is mounted, a first heat storage unit and a second heat storage unit covering upper and lower parts of the memory module, respectively, to store heat emitted by the memory module, and having at least portions connected to each other, respectively, a cover having a space in which the memory module and the first and second heat storage units are received and arranged with a spacing distance from the first and second heat storage units, respectively, and an inner frame arranged between the cover and at least one of the first and second heat storage units, to provide the spacing distance.

20 Claims, 6 Drawing Sheets

SOLID-STATE DRIVE CASE AND SOLID-STATE DRIVE DEVICE USING THE SAME

CROSS-REFERENCE TO RELATED APPLICATION(S)

This application claims benefit of priority to Korean Patent Application No. 10-2018-0027963 filed on Mar. 9, 2018, with the Korean Intellectual Property Office, the disclosure of which is incorporated herein by reference in its entirety.

BACKGROUND

1. Field

Example embodiments of present inventive concepts relate to a solid-state drive case and/or a solid-state drive device using the same.

2. Description of Related Art

A solid-state drive device is emerging as a next-generation storage device to replace traditional hard disk drives. A solid-state drive device is a storage device based on a non-volatile memory, with low power consumption and high storage density. In addition, when a solid-state drive device is used as a storage device, input and output of large amounts of data may be performed at high speed and demand is expected to increase.

On the other hand, as input and output speeds of the solid-state drive device increase, heat produced by the solid-state drive device may increase, and, thus, the solid-state drive device may more frequently enter a performance throttling operation, in which to prevent damage to the solid-state drive device, power consumption is reduced. However, such performance throttling may also reduce the performance of the memory module.

In addition, as a use of the solid-state drive device extends to a portable storage device area, methods for securing the reliability of the stored data may be desired, by reducing an impact applied to thy: outside of the solid-state drive device.

SUMMARY

At least one example embodiment of the present inventive concepts relates to a solid-state drive case capable of delaying entry time of the performance throttling feature step, and reducing (or, alternatively, preventing) damage by alleviating an external impact, and a solid-state drive device using the solid-state drive case.

According to an example embodiment of the present inventive concepts, a solid-state drive device includes a memory module including at least one non-volatile memory device mounted thereon; a pair of heat storage elements including a first heat storage element and a second heat storage element covering an upper part and a lower part of the memory module, respectively, the pair of heat storage elements configured to store heat emitted by the memory module, a first one of the pair of heat storage elements having at least a portion thereof connected to a second one of the pair of heat storage elements; a cover configured to receive the memory module and the pair of heat storage elements in a space therein; and an inner frame between the cover and at least one of the pair of heat storage elements such that the cover is separated from the at least one of the pair of heat storage elements by a spacing distance.

According to an example embodiment of the present inventive concepts, a memory module including at least one non-volatile memory device mounted there; a solid-state drive device includes a pair of heat storage elements including a first heat storage element and a second heat storage element covering an upper part and a lower part of the memory module, respectively, pair of heat storage elements configured to store heat emitted by the memory module, a first one of the pair of heat storage elements having at least a portion connected to a second one of the pair of heat storage elements; and a pair of covers including a first cover and a second cover covering the first heat storage element and the second heat storage element, respectively, the first cover and the second cover configured to interconnect to provide an inner space housing the memory module and the pair of heat storage elements such that the pair of covers are separated from the pair of heat storage elements by a spacing distance.

According to an example embodiment of the present inventive concepts, a solid-state drive case includes a pair of heat storage elements including a first heat storage element and a second heat storage element covering an upper part and a lower part of a memory module, respectively, the pair of heat storage elements configured to store heat emitted by the memory module, a first one of the pair of heat storage elements having at least a portion thereof connected to a second one of the pair of heat storage elements; a pair of covers including a first cover and a second cover covering the first heat storage element and the second heat storage element, respectively, the pair of covers having an inner space therebetween housing the memory module and the pair of heat storage elements such that the pair of covers are separated from the pair of heat storage elements by a spacing distance; and an inner frame in at least one of the first cover and the second cover and a corresponding one of the pair of heat storage elements the inner frame configured to maintain the spacing distance between the at least one of the first cover and the second cover and the corresponding one of the pair of heat storage elements.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Hereinafter, example embodiments of the present inventive concepts will be described with reference to the accompanying drawings.

Figure 1:
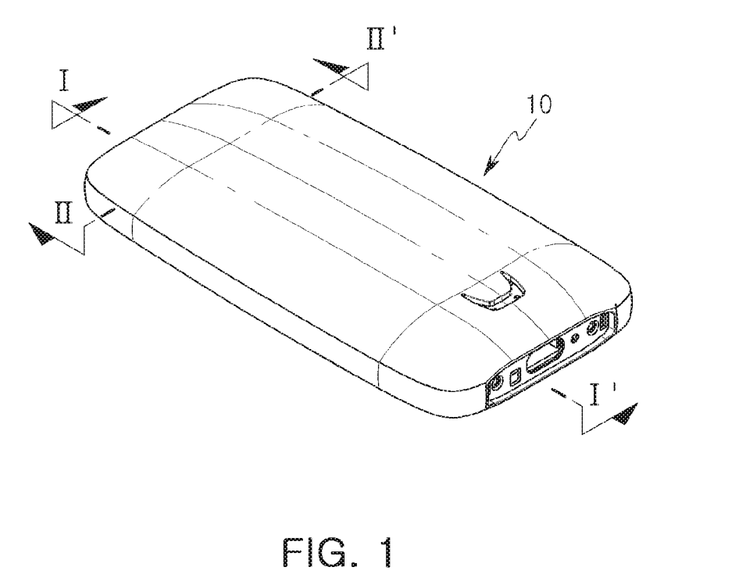
FIG. 1 is a perspective view of a solid-state drive device according to an example embodiment of the present inventive concepts.
Figure 2:
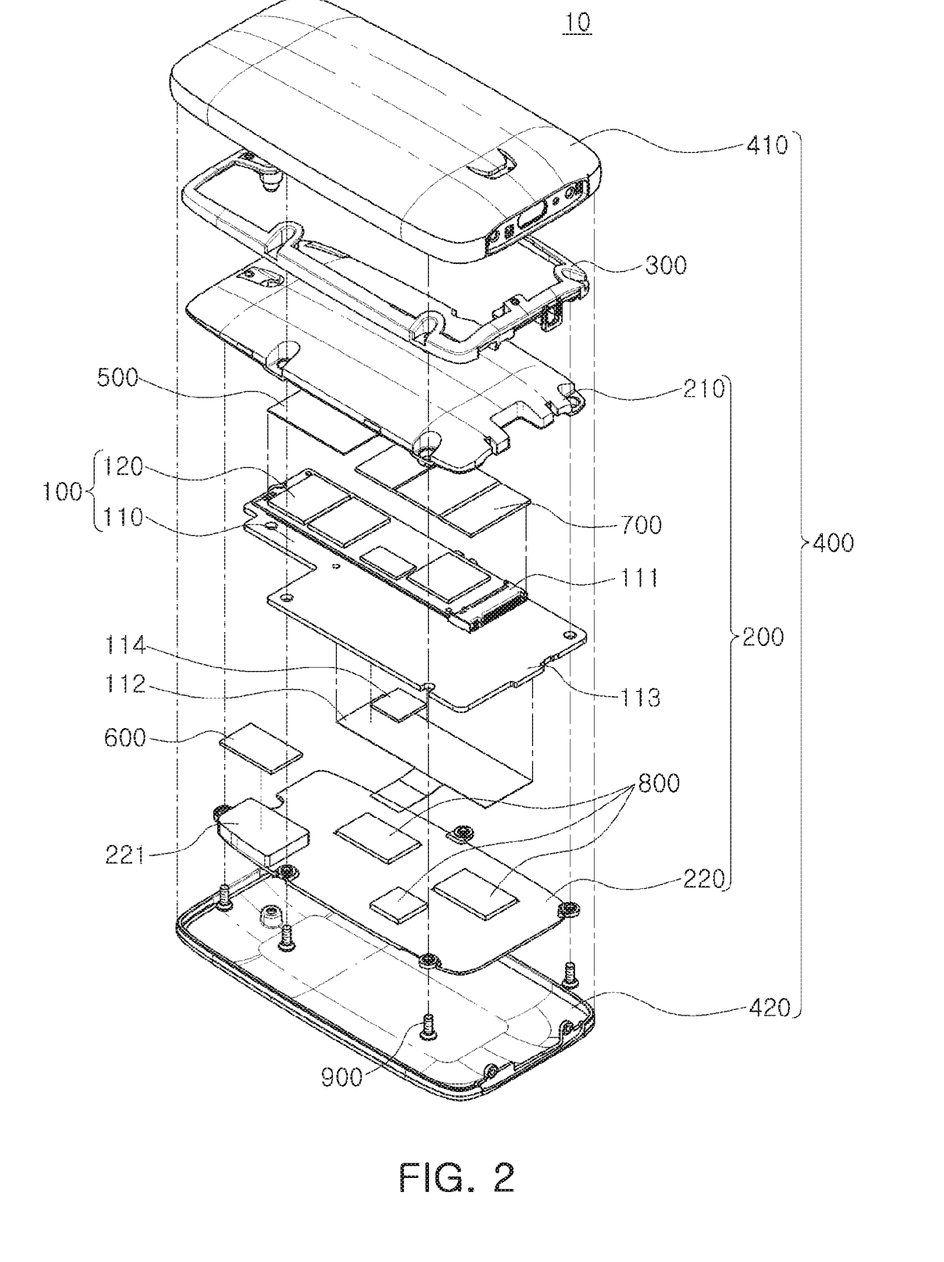
FIG. 2 is an exploded perspective view of the solid-state drive device of FIG. 1.
Figure 3:
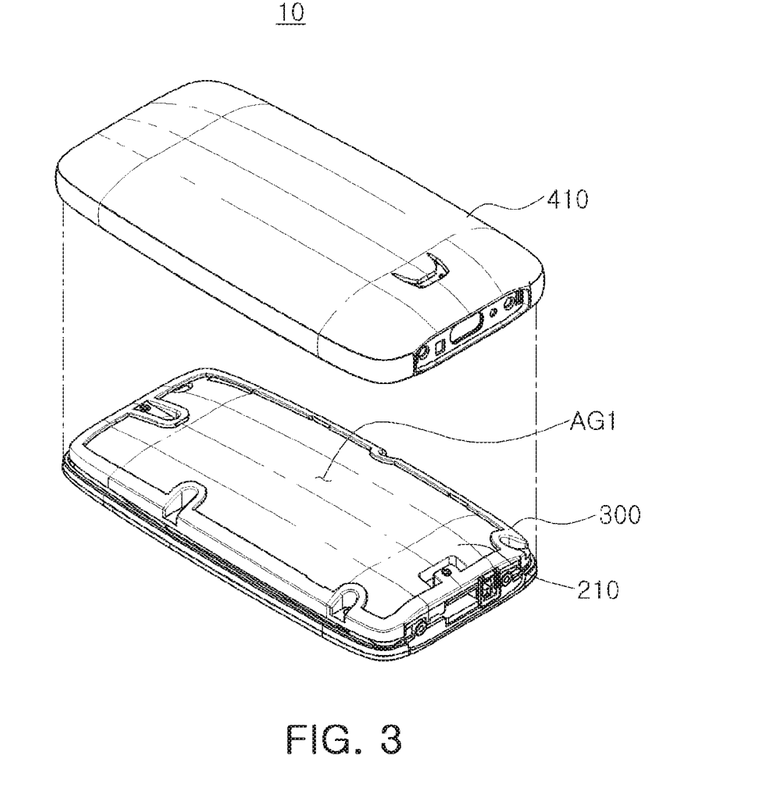
FIG. 3 is a partially exploded perspective view of the solid-state drive device of FIG. 1 from which only the first cover is detached.
Figure 4:
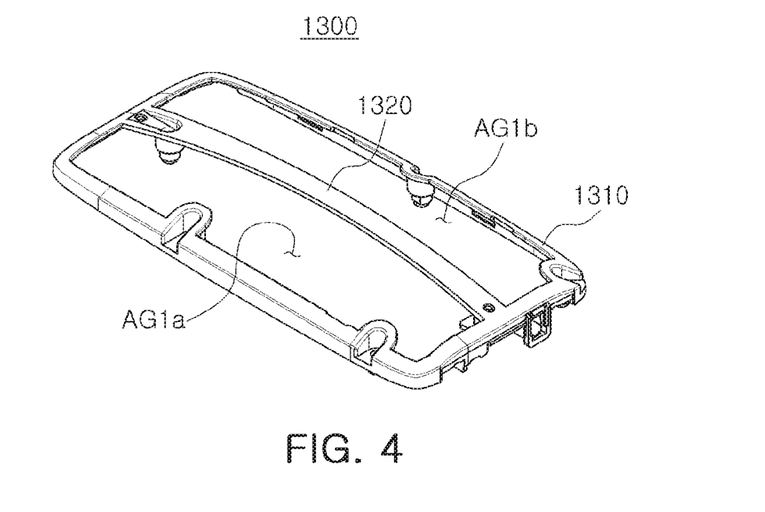
FIG. 4 is an example of a modification of an inner frame of FIG. 2.
Figure 5:
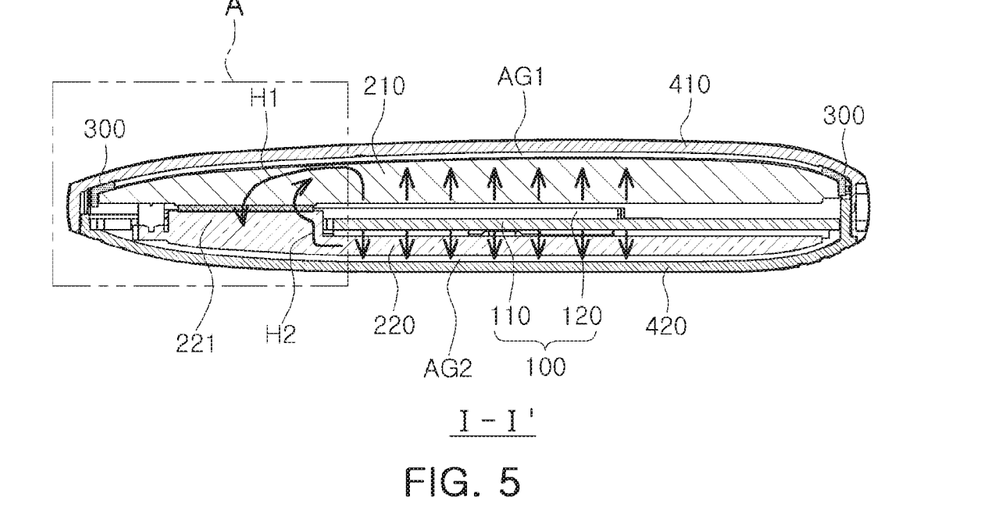
FIG. 5 is a cross-sectional view taken along line I-I' of FIG. 1.
Figure 6:
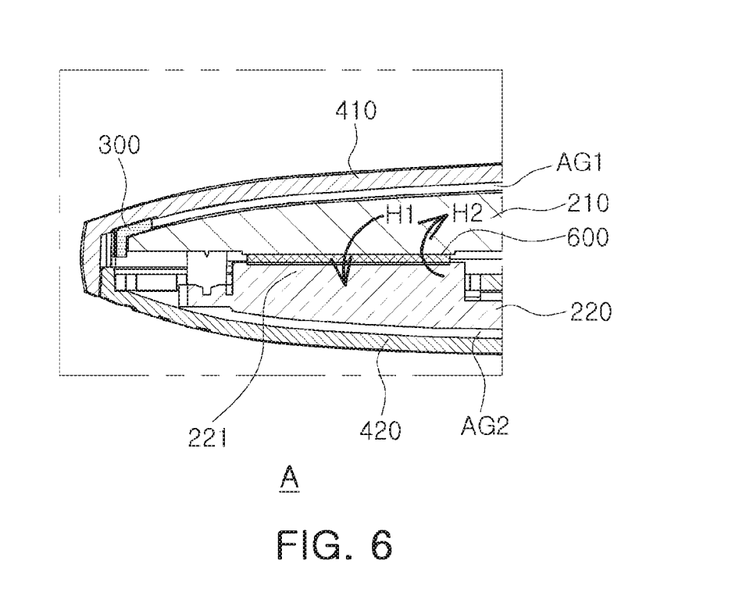
FIG. 6 is an enlarged view of a portion A of FIG. 5.
Figure 7:
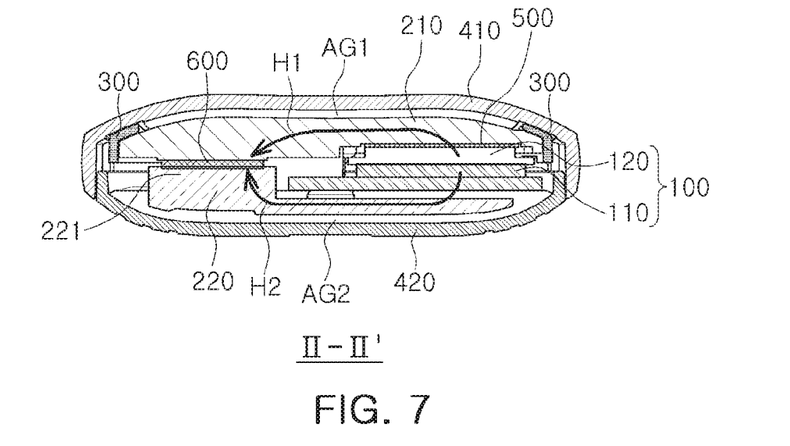
FIG. 7 is a cross-sectional view taken along line II-II' of FIG. 1.
Figure 8:
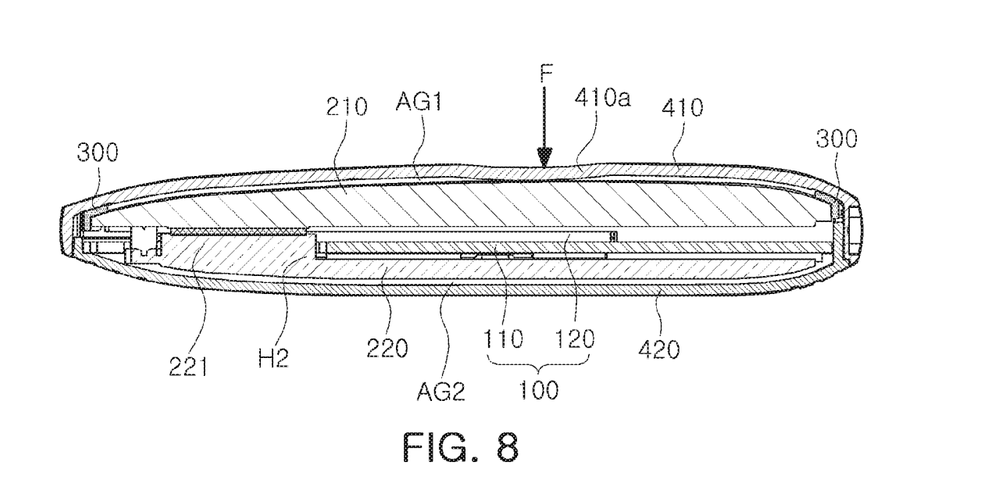
FIG. 8 is a cross-sectional view illustrating a state in which the solid-state drive device of FIG. 1 is deformed by external force.
Figure 9:
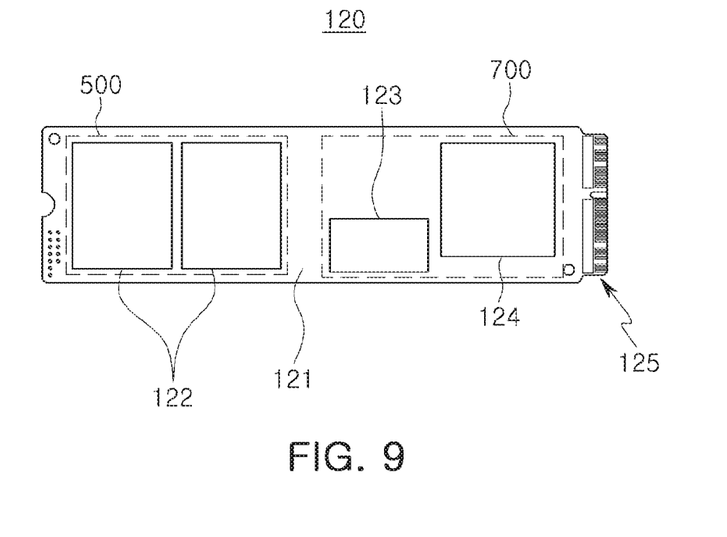
FIG. 9 is a plan view illustrating a solid-state drive of an example embodiment that may be applied to a memory module of the present inventive concepts.

FIG. 1 is a perspective view of a solid-state drive device by an example embodiment of the present inventive concept, and FIG. 2 is an exploded perspective view of the solid-state drive device of FIG. 1. FIG. 3 is a partially exploded perspective view illustrating only that the first cover is detached from the solid-state drive device from FIG. 1. FIG. 4 is an example of a modification of an inner frame of FIG. 2. FIG. 5 is a cross-sectional view taken along line I-I' of FIG. 1, and FIG. 6 is an enlarged view of a portion A of FIG. 5. FIG. 7 is a cross-sectional view taken along line II-II' of FIG. 1. FIG. 8 is a cross-sectional view illustrating a state in which the solid-state drive device of FIG. 1 is deformed by external force. FIG. 9 is a plan view illustrating a solid-state drive of an example embodiment that may be applied to a solid-state drive device of the present inventive concept.

Referring to FIGS. 1 and 2, a solid-state drive device 10 according to an example embodiment of the present inventive concepts may include a memory module 100, a heat storage unit 200 being arranged to cover the memory module 100, a cover 400 being arranged to have a spacing distance with the heat storage unit 200, and an inner frame 300 providing a spacing distance between the heat storage unit 200 and the cover 400.

The solid-state drive device 10 may have various structures, sizes, dimensions, volumes, interfaces, and/or compatibilities. Each set of characteristics may be referred to as a form factor. For example, the form factor of the solid-state drive device 10 may be one of a 1.8 inch and 2.5 inch Serial Advanced Technology Attachment (SATA)-2 standard structure. However, example embodiments are not limited thereto. For example, the solid-state drive device 10 may have other form factors that meet the requirements of housing the connector connecting the solid-state drive device 10 and an external device.

The memory module 100 may be a volatile memory device such as a DRAM, a non-volatile memory device such as a flash memory, a controller communicating with external devices and inner memory components, passive members such as resistors and capacitors, and a substrate taking other electrical and electronic components such as a printed circuit board PCB as needed. For example, the memory module 100 may be provided with a structure in which the solid-state drive including a memory device is combined with a bridge board. Also, the memory device may be provided with a structure in which the memory device is directly applied to a module substrate without a separate bridge board.

In the example embodiment described, the memory module 100 of an example embodiment is described as an example in which the memory module 100 includes a solid-state drive 120 combined with a bridge board 110. However, example embodiments, are not limited thereto.

The heat storage unit 200 may be arranged to cover upper and lower parts of the memory module 100 and may store heat emitted by the memory module 100 to lower the temperature of the memory module 100.

The heat storage unit 200 may include the first and second heat storage units 210 and 220 covering the upper part and the lower part, respectively; however, the memory module 100 may only be arranged on one of the upper and lower parts according to the example embodiment. The first heat storage unit 210 and the second heat storage unit 220 may store heat emitted by the memory module 100 and may have a sufficient heat capacity to delay radiation of the stored heat to the cover 400 for a time allowed.

The first heat storage unit 210 and the second heat storage unit 220 may be formed of a single material or a combination of different materials considering the characteristics of heat storage. The first and second heat storage units may be made of the same material but may be made of different materials to have different thermal conductivities. The heat storage unit 200 may be formed of a metal, a carbon-based material, a polymer material, or a combination of thereof, but is not limited thereto. The heat storage unit 200, for example, may be made of a material having a high thermal conductivity, such as copper, an aluminum alloy, a stainless steel alloy, or a magnesium alloy.

Referring to FIGS. 5 and 6, the first and the second heat storage units 210 and 220 are arranged to cover upper and lower parts of the memory module 100 and therefore, may respectively absorb and store heat H1 and H2 emitted to the direction of the upper and lower parts of the memory module 100. And heat exchange may be achieved between the first and the second heat storage units 210 and 220 by providing common connection areas. Therefore, though heat of the memory module 100 is concentrated in one of the first heat storage unit or the second heat storage units 210 and 220, the heat H1 and H2 stored in the first and second heat storage unit may be uniformly conducted.

For example, in some example embodiments, the second heat storage unit 220 may include a connection unit 221 protruding therefrom that is in thermal contact with the first heat storage unit 210. However, example embodiments are not limited thereto. For example, the connection unit 221 may be formed in the first storage unit 210, and the connection unit 221 may be formed in both the first and the second heat storage units 210 and 220. In addition, the connection unit 221 may be formed in a plurality of areas.

Referring back to FIG. 2, in some example embodiments, the first storage unit 210 and the second heat storage unit 220 may be in direct common contact. However, in other example embodiments, a thermal conduction efficiency may be improved by a thermal contact through a thermal interface material 600 (TIM). The thermal interface material 600 may be a material promoting heat transfer, for example, a grease, a thermally conductive adhesive, a mineral oil, a gap filler putty, a phase change material, a gel or pad or a particle filled epoxy composed of a polymeric material. In addition, for example, commercially available greases include ShinEtsu G750, ShinEtsu G751, ShinEtsu G765, Berquist TIC-7500, and a phase change materials are Thermax HF60110-BT, Chromerics T725, Chromerics T443, Chromerics T454, Thermagon T-Berquist 200-U, Berquist HiFlow 225-U, Berquist HiFlow 225-UT and commercially available thermally conductive adhesives include Chromerics therm-A-form T642. However, example embodiments are not limited to these materials.

In addition, the heat storage unit 200 may be arranged to cover upper and lower parts of the memory module 100 but to be spaced apart to make the thermal contact through a thermal interface material 500. The first and second heat storage units 210 and 220 are advantageous in heat conduction as the first and second heat storage units 210 and 220 are closer to the memory module 100, but a short of a circuit wiring of the memory module 100 may occur when the first and second heat storages are arranged in direct contact with the memory module 100. Therefore, the thermal contact may be made through the thermal conductive material 500 having insulating properties. The thermal conductive material 500 may be arranged in an area in which the non-volatile memory device is arranged in consideration of heat distribution of the memory module 100.

The heat storage unit 200 may increase the time taken for the memory module 100 to enter a performance throttling operation. The memory module 100 may be configured to perform the performance throttling operation. When the memory module 100 is overheated, the circuit components may be protected from damage, by intentionally reducing power consumed through the performance throttling operation. When the memory module 100 enters the performance throttling operation, the memory module may protect the circuit components from damage, but in the process of reducing the power consumption, the performance of the memory module may be reduced. Accordingly, as the memory module 100 rapidly enters the performance throttling operation, the time for the memory module 100 to operate with normal performance is reduced.

As the performance of the memory module 100 has recently improved, processing speeds have increased while power consumption has increased, and heating has also increased. Example embodiments of the present inventive concepts may increase the time taken before the memory module 100 enters the performance throttling operation by rapidly emitting heat generated from the memory module 100 through the heat storage unit 200. Therefore, a duration of time that the memory module 100 maintains in a normal performance operation may be increased.

In addition, the solid-state drive device 10 may include impact absorbing members 700 and 800 located between the heat storage unit 200 and the memory module 100. The impact absorbing members 700 and 800 absorb impacts transmitted through the heat storage unit 200, thereby reducing impacts transmitted to the memory module 100. The impact absorbing members 700 and 800 may be an elastic body having adhesive layers formed on both sides. For example, the elastic body may be a rubber, a urethane, or the like, but is not limited thereto. When the elastic body itself has adhesiveness, the adhesive layer may be omitted.

Referring to FIGS. 2 and 5, the cover 400 may be arranged to cover the first and second heat storage units 210 and 220 while keeping the spacing distances AG1 and AG2 therebetween. The cover 400 may provide the inner space in which the first and the second heat storage units 210 and 220 are received, and may form an exterior of the solid-state drive device 10. The cover 400 may include the first and second covers 410 and 420 arranged in the first and second heat storage units 210 and 220, respectively, and the first and second covers 410 and 420 may be connected to each other. However, example embodiments of the present inventive concepts are not limited thereto. For example, in some example embodiments, the cover 400 may be integrally formed.

The solid-state drive device 10 may be assembled through the following method of manufacturing the solid-state drive device 10.

First, the memory module 100 is prepared, and the first and second heat storage units 210 and 220 are arranged in the upper part and the lower part, respectively. At this time, the thermal conductive material 600 is arranged in the connection unit 221 in which the first and second heat storage units 210 and 220 are in common contact, so that the first and second heat storage units 210 and 220 may be in thermal common contact. In addition, the thermal conductive material 500 and the impact absorbing member 700 are arranged in an area in which the memory module 100 and the first heat storage unit 210 are in common contact, so that the memory module 100 and the first heat storage unit 210 may be in thermal common contact, and an impact applied to the memory module 100 from the first heat storage unit 210 may be reduced. The impact absorbing member 800 may be arranged in an area in which the memory module 100 and the second heat storage unit 220 are in common contact to reduce an impact transmitted from the second heat storage unit 220.

Subsequently, the inner frame 300 and the first cover 410 are arranged on the first heat storage unit 210, and the memory module 100, the first and second heat storage units 210 and 220, the inner frame 300, and the first cover 410 may be coupled to each other using a coupling member 900 such as screws heading for the first cover 410 in the second heat storage unit 210. The coupling member 900 is formed of a metal having high thermal conductivity and may allow for a heat exchange between the first and second heat storage units 210 and 220 through the coupling member 900.

Subsequently, the second cover 420 is arranged to cover the second heat storage unit 220, and may assemble the solid-state drive device 10, by coupling the first cover 410 and the second cover 420 to each other. However, example embodiments are not limited thereto. For example, in other example embodiments, the second cover 420 may cover the second heat storage unit 220 prior to the first cover 410 covering the first heat storage unit 210.

In addition, referring to FIGS. 5 to 7, the first and second covers 410 and 420 are spaced apart from the first and second heat storage units 210 and 220 by spacing distances AG1 and AG2, respectively, and, thus, the solid-state drive device 10 may reduce (or, alternatively, prevent) the heat stored in the first and second heat storage units 210 and 220 from being conducted directly to the first and second covers 410 and 420 through the thermal contact. Therefore, compared to the case in which the first and second covers 410 and 420 and the first and second heat storage units 210 and 220 are in direct common contact, the surface temperatures of the first and second covers 410 and 420 may be kept relatively low. As described above, since the surface temperatures of the first and second covers 410 and 420 may be kept relatively low, even though the user touches the first and second covers 410 and 420 while using the solid-state drive device 10, a likelihood of exposure to high temperature may be reduced (or, alternatively, eliminated).

In addition, the first and second covers 410 and 420 may be arranged with the first and second heat storage units 210 and 220 while keeping the spacing distances AG1 and AG2, respectively. Therefore, even though external force is applied to the solid-state drive device 10, it may be buffered through the spacing distances AG1 and AG2. A likelihood that such external force is directly applied to the first and second heat storage units 210 and 220 and the memory module 100 may be reduced (or, alternatively eliminated), even though external force is applied to the first and second covers 410 and 420.

FIG. 8 illustrates that external force F is applied to one area 410A of the first cover 410 and the depression is made in the spacing distance AG1, and is buffered. It can be seen the spacing distance AG1 is used as a buffer area for reducing external force F is directly transferred to the first and second heat storage units 210 and 220 and the memory module 100.

The first and second covers 410 and 420 are made of a material having a high thermal conductivity in the same manner as the first and second heat storage units 210 and 220. Therefore, heat transferred by radiation or convection to the first and second covers 410 and 420 in the first and second heat storage units 210 and 220 through the spacing distances AG1 and AG2 may be emitted from the surface of the first and second covers 410 and 420 to the air.

Referring to FIG. 2, an example embodiment illustrates that the memory module 100, the first and second heat storage units 210 and 220, and the inner frame 300 are fixed to the first cover 410 through the coupling member 900 such as a screw. However, example embodiments are not limited thereto and may be variously modified as being fixed to the second cover 420.

The inner frame 300 is arranged between the heat storage unit 200 and the cover 400 to fix the heat storage unit 200 to the inner space of the cover 400. The spacing distances AG1 and AG2 may be formed by an space between the heat storage unit 200 and the cover 400. The inner frame 300 is configured to be locked in the heat storage unit 200, but is not limited thereto, and may be bonded or combined by a screw. An example embodiment will be described taking a case in which the inner frame 300 is arranged between the first cover 410 and the first heat storage unit 210 as an example, but example embodiments of the present inventive concepts is not limited thereto. For example, the inner frame may be arranged between the second cover 420 and the second heat storage unit 220.

Referring to FIG. 3, the inner frame 300 may be formed in a ring shape to be in a limited contact with an edge of the first heat storage unit 210, and may be configured to have the spacing distance AG1 between the first heat storage unit 210 and the first cover 410. The spacing distance AG1 may be arranged at a desired (or, alternatively, a predetermined) interval between the first heat storage unit 210 and the first cover 410, but is not necessarily arranged to maintain a uniform interval. And the space may be arranged to be spaced apart by an interval sufficient to delay heat in the first heat storage 210 being directly radiated to the first cover 410 by insulating between the first storage unit 210 and the first cover 410. The inner frame 300 may be configured to secure the spacing distance AGI to be sufficient in the central region of the first heat storage unit 210. A thickness and width of the inner frame 300 may be increased or decreased in accordance with the size of the spacing distance AG1 to be secured. However, a shape of the inner frame 300 is not limited to being in contact with an edge of the first heat storage part 210, and may be further include an area reinforcing the rigidity of the inner frame 30 to firmly support the first cover 410, in the range in which the spacing distance AGI is not excessively reduced. The inner frame 300 may form a reinforcing support unit 1320 being arranged across the central region to divide the spacing distances into the first and second spacing distances AG1a and AG1b, as an example: of a variation of the inner frame 300 of FIG. 2 to increase the structural rigidity of the inner frame 300.

The inner frame 300 may be formed of a material having lower thermal conductivity than the thermal conductivity of the heat storage unit 200 and the cover 400. For example, the inner frame 300 may be made of a synthetic resin such as a phenol resin, an epoxy resin, a polyimide resin, and the like. Accordingly, the inner frame 300 may delay heat stored in the heat storage unit 200 from being conducted directly to the cover 400 through the inner frame 300.

Depending on example embodiments, the inner frame 300 may be integrally formed with the heat storage unit 200 or the cover 400. In this case, an effect of delaying the heat conduction may be lowered compared with the case in which the inner frame 300 is formed of a material having a lower thermal conductivity, than the thermal conductivity of the heat storage unit 200 and the cover 400. However, production costs may be reduced since the cover 400 may be integrally formed.

Referring back to FIG. 2, the memory module 100 may be provided a structure in which the solid-state drive 120 is coupled to the bridge board 110. The bridge board 110 may have a socket 111 into which the solid-state drive 120 is inserted on one side and a first connector 113 having connection terminals for connection with external device may be provided at one end. Accordingly, the bridge board 110 may be connected to the external device through the first connector 113. An interface converting device 114 for changing an interface of the socket 111 to another type of interface (for example, Thunderbolt™) may be further arranged on the lower surface of the bridge board 110.

A thermal spreader 112 for emitting heat may be arranged on the interface converting device 114 in which a lot of heat is generated, and heat generated from the interface converting device 114 may be rapidly emitted. The thermal spreader 112 may be formed of a metal such as copper, an aluminum alloy, a stainless steel alloy, and a magnesium alloy, which has high thermal conductivity. The thermal spreader 112 is formed in a thin plate shape and may be attached to the interface converting device 114.

Further referring to FIG. 2, the impact absorbing member 800 may arranged between the thermal spreader 112 and the second heat storage unit 220.

FIG. 9 is a plan view illustrating the solid-state drive 120 of an example embodiment, which may be applied to the memory module of the present inventive concepts.

Referring to FIG. 9, the solid-state drive 120 may include a module substrate 121, a plurality of electronic components mounted on the module substrate 121, and a second connector 125.

The module substrate 121 may be a single layer or a multi layer circuit board. For example, the module substrate 121 may be a printed circuit board (PCB). The PCB may include wirings formed on the surface or inside thereof and vias for connecting the wirings. The wirings may be a printed circuit pattern for interconnecting the electronic components. The module substrate 121 may have a rectangular or square shape. The second connector 125 having connecting terminals for connecting to the socket 111 of the bridge board 110 may be provided at one end of the module substrate 121.

The electronic components may include at least one non-volatile memory device 122, a buffer memory device 123, and a controller device 124.

The solid-state drive 120 may be detachably attached to the bridge board 110 through the second connector 125. The second connector 125 of the module substrate 121 may be inserted into the socket 111 of the bridge board 110 and the like. The socket 111 may include a female connector. Accordingly, the solid-state drive 120 may be electrically connected to the bridge board 110 by the terminals of the second connector 125.

The at least one non-volatile memory device 122 may be provided on the module substrate 121 and may be provided on upper and lower parts of the module substrate 121 when a plurality of non-volatile memory devices 122 are provided.

In an example embodiment, the case that two non-volatile memory devices 122 are arranged on upper and lower parts of the module substrate 121 is shown as an example.

The non-volatile memory device 122 may be used as a storage medium of the solid-state drive 120. The non-volatile memory device 122, for example, may be a NAND flash memory, a phase-change RAM (PRAM), or a ferro-electric RAM (FRAM). The non-volatile memory device 122 may be connected to the controller device 124 through at least one channel. The non-volatile memory device 122 may include a single non-volatile memory chip or a plurality of non-volatile memory chips which are stacked.

The buffer memory device 123 may be arranged to be adjacent to the controller device 124 on the upper surface of the module substrate 121. The buffer memory device 123 may be used as a buffer area for temporarily storing data transferred from the bridge board 110 or for temporarily storing data read from a non-volatile memory device 122. In addition, a buffer memory device 123 may be used to drive software S/W used for efficient management of the non-volatile memory device 122. In addition, the buffer memory device 123 may be used to store metadata input from the bridge board 110 or to store a cache data.

The controller device 124 may provide an interface and a protocol between the bridge board 110 and the non-volatile memory device 122. The controller device 124 may provide a standard protocol such as parallel advanced technology attachment (PATA), serial advanced technology attachment (SATA), SCSI, or PCI Express (PCIe) for the interface between the non-volatile memory device 122 and the bridge board 110. In addition, the controller device 124 may perform wear leveling, garbage collection, bad block management and/or error correcting code (ECC) for the non-volatile memory device 122.

On the non-volatile memory device 122, the above-described thermal conductive material 500 may be arranged. The impact absorbing member 700 may be arranged on the controller device 124 and/or the buffer memory device 123 to absorb external force transmitted through the first heat storage unit 210, and reduce transference to the solid-state drive device 10.

In addition, an active device or a passive device such as a chip resistor, a chip capacitor, an inductance, a switch, a temperature sensor, a DC-DC converter, a quartz or a voltage regulator for generating a clock may be further mounted on the module substrate 121.

However, a structure of the memory module 100 is not limited to the above-described embodiment, and the non-volatile memory device 122 may be directly mounted on the module substrate 121, without a separate bridge board.

In an example embodiment, the solid-state drive device 10 may be configured to perform a performance throttling operation as described below.

A temperature of the non-volatile memory device 122 may excessively rise as a data writing/reading operation proceeds at a high speed. The non-volatile memory device 122 may secure reliability only when operated at a desired (or, alternatively, a predetermined) temperature or lower. Therefore, the non-volatile memory device 122 should be operated at the desired (or, alternatively, the predetermined) temperature or lower for reliability.

The solid-state drive device 10 may include a temperature sensor installed in proximity to the memory module 100 to sense the temperature of the non-volatile memory device 122, and the temperature of the memory module 100 may be periodically measured. When a temperature higher than a upper limit reference temperature is measured by the temperature sensor, the solid-state drive device 10 may lower the performance of the solid-state drive device 10 by performing the performance throttling operation. In addition, the solid-state drive device 10 may terminate the performance throttling operation when the temperature of the memory module 100 is lower than a lower limit reference temperature, and, thus the performance of the solid-state drive device 10 may be restored.

The solid-state drive device 10 of an example embodiment may rapidly emit heat of the memory module 100, by storing heat generated from the memory module 100 through the heat storage unit 200. Therefore, since the temperature rise of the memory module 100 is delayed, an amount of time until the solid-state drive device 10 initiates the performance throttling operation of the solid-state drive device 10 may be further delayed. Thus, a state in which the performance of the solid-state drive device 10 is normally maintained may be extended. For example, the performance of the solid-stated drive device 10 may be adjusted through an idle time scaling between a frequency scaling and an input/output (I/O) command.

Figure 10:
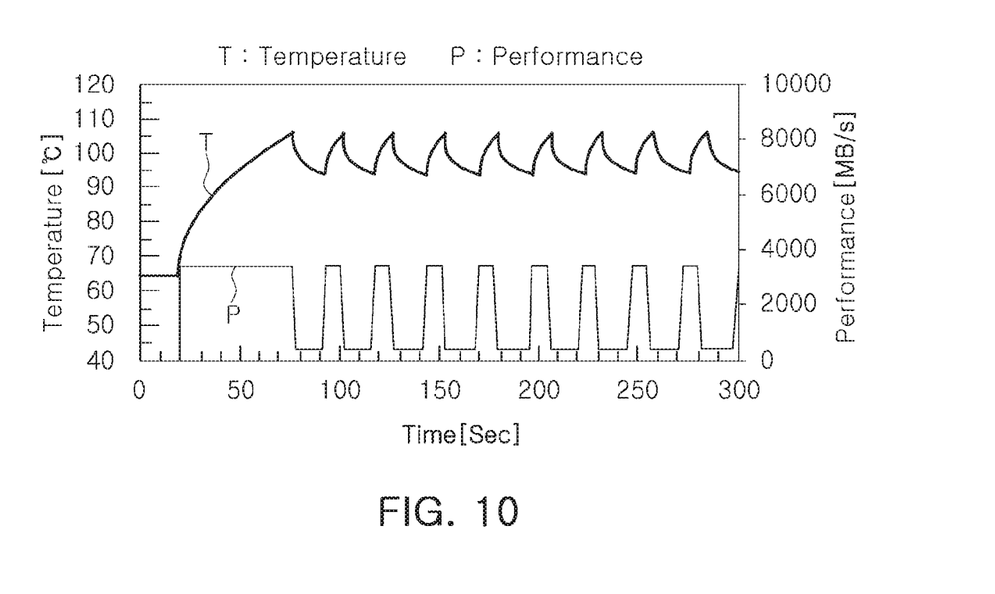
FIG. 10 is a graph explaining a performance throttling feature of a solid-state device according to an example embodiment.

FIG. 10 is a graph explaining the performance throttling feature.

Referring to FIG. 10, in an example embodiment, the upper limit reference temperature is set at 105° C., and the lower limit temperature is set at 95° C. As a temperature of the memory module 100 is set at 105° C., the performance throttling feature of the solid-state drive device 10 is operated, and the temperature of the memory module is reduced. In addition, as the temperature of the memory module 100 decreases to 95° C., the performance throttling feature is terminated and the performance of the solid-state drive device 10 returns to a normal state.

In addition, in the case of the solid-state drive device 10 for a general consumer, together with the temperature of the non-volatile memory device 122, the temperature of the external first and second covers 410 and 420, which a user directly touches, may be important. For example, when the temperature of the first and second covers 410 and 420 exceeds 45° C., the user may feel uncomfortable.

For this, when the desired (or, alternatively, the predetermined) temperature value of the non-volatile memory device 122 in a case that at least one of the first and second covers 410 and 420 is 45° C. is a set value (for example, 60° C.), and when the temperature of the non-volatile memory device 122 reaches the desired (or, alternatively, the predetermined) temperature, the solid-state drive device 10 may perform the performance throttling operation.

In detail, a power supplied to the non-volatile memory device 122 in the solid-state drive device may be reduced to reduce heat emitted from the non-volatile memory device 122. In a thermal aspect, heat is generated in various semiconductor devices in the memory module 100, however, particularly, heat emitted from the non-volatile memory device is transferred to the heat storage unit 200, the inner frame 300 and the external cover 400. The heat storage unit 200 may function as a heat storage accumulating heat and emitting heat slowly. Thus, only a portion of the heat emitted from the non-volatile memory device 122 may be transmitted to the cover 400 of the solid-state drive device 10. Therefore, the temperature rise of the cover 400 may be delayed and heat may be emitted more efficiently to an external environment in a short time, since a heat energy accumulated in the cover 400 is small. Nonetheless, when the performance throttling operation is required, the solid-state drive device 10 performs the performance throttling operation and reduces the power supplied to the solid-state drive device 10, and the temperature rise of the non-volatile memory device 122 of the solid-state drive device 10 and the cover may be reduced as well as the temperature may be reduced to a certain temperature or lower. When the temperature of the cover 400 is sufficiently lowered, the power supplied to the non-volatile memory device 122 may be returned to the original state to maintain the performance of the nonvolatile memory device 122 at a desired (or, alternatively an optimal) level.

Table 1 below shows experimental data comparing time by the time which the performance throttling operation of an example embodiment and a comparative example in which the first and second heat storage units are not applied, is operated.

The comparative example has a same configuration as the configuration of an embodiment except that the first and second heat storage units are not applied. The comparative example and an embodiment are cases in which the first and second covers and the first and second heat storage units are made of a magnesium (Mg) alloy.

As can be seen in Table 1 below, in an example embodiment, time required before the performance throttling operation is initiated at the time of a sequential writing operation (Seq. Write) is increased by 276%, and time required before the performance throttling operation s initiated at the time of a sequential reading operation (Seq. Read) is increased by 290%. Accordingly, it can be seen that an amount of time before entering the performance throttling operation is significantly increased in an example embodiment as compared with comparative example, and, thus the amount of time the solid-state drive device 10 operates at a normal speed is further increased.

TABLE 1

|  | Entry time in sequential writing operation (sec) | Entry time in sequential reading operation (sec) |
| --- | --- | --- |
| Comparative example | 102 | 100 |
| Embodiment | 282 | 290 |

Although the solid-state drive device 10 including the memory module 100 has been described above, the solid-state drive device 10 may be provided as a state in which the memory module 100 is removed.

As set forth above, according to example embodiments of the present inventive concepts, a solid-state drive case and a solid-state drive using the solid-state drive case may increase the amount of time for using the solid-state drive device in a normal performance operation by increasing the amount of time the solid-state drive device operates normally before entering the performance throttling operation, and alleviate an external impact to reduce (or, alternatively, prevent) damage.

While example embodiments have been shown and described above, it will be apparent to those skilled in the art that modifications and variations could be made without departing from the scope of the example embodiments of the present inventive concepts as defined by the appended claims.

What is claimed is:

1. A solid-state drive device comprising:
   a memory module including at least one non-volatile memory device mounted thereon;
   a pair of heat storage elements including a first heat storage element and a second heat storage element covering an upper part and a lower part of the memory module, respectively, the pair of heat storage elements configured to store heat emitted by the memory module, a first one of the pair of heat storage elements having at least a portion thereof connected to a second one of the pair of heat storage elements;
   a cover configured to receive the memory module and the pair of heat storage elements in a space therein; and
   an inner frame positioned between the cover and the pair of heat storage elements such that the cover is separated from each of the pair of heat storage elements by a spacing distance.

2. The solid-state drive device according to claim 1, wherein the cover comprises:
   a first cover and a second cover, the first cover and the second cover configured to receive the memory module and the pair of heat storage elements in the space formed between the first cover and the second cover.

3. The solid-state drive device according to claim 1, wherein a material of the inner frame has a lower thermal conductivity than a thermal conductivity of the pair of heat storage elements.

4. The solid-state drive device according to claim 1, wherein the memory module comprises:
   a bridge board having a socket and a first connector, the first connector configured to connect the memory module to an external device,
   a second connector connected to the socket, and
   a substrate in which the at least one non-volatile memory device is mounted thereto.

5. The solid-state drive device according to claim 1, wherein the memory module comprises:
   a substrate in which the at least one non-volatile memory device is mounted thereto, the substrate including a first connector configured to connect to an external device.

6. The solid-state drive device according to claim 5, wherein the non-volatile memory device is configured to make thermal contact with one or more of the first heat storage element and the second heat storage element through a thermal interface material (TIM).

7. The solid-state drive device according to claim 1, wherein the first heat storage element is configured to make a thermal contact with the second heat storage element in the portion through a thermal interface material (TIM).

8. The solid-state drive device according to claim 1, further comprising:
   an impact absorbing member between at least one of the pair of heat storage elements and the memory module.

9. The solid-state drive device according to claim 2, wherein the memory module, the pair of heat storage elements, and the inner frame are coupled to the first cover via a coupling member.

10. A solid-state drive device comprising:
    a memory module including at least one non-volatile memory device mounted thereon;
    a pair of heat storage elements including a first heat storage element and a second heat storage element covering an upper part and a lower part of the memory module, respectively, the pair of heat storage elements configured to store heat emitted by the memory module, a first one of the pair of heat storage elements having at least a portion connected to a second one of the pair of heat storage elements; and
    a pair of covers including a first cover and a second cover covering the first heat storage element and the second heat storage element, respectively, the first cover and the second cover configured to interconnect to provide an inner space housing the memory module and the pair of heat storage elements such that each of the pair of covers are separated from each of the pair of heat storage elements by a spacing distance.

11. The solid-state drive device according to claim 10, further comprising:
an inner frame in the inner space between at least one of the first cover and the second cover and a corresponding one of the pair of heat storage elements, the inner frame configured to maintain the spacing distance between the at least one of the first cover and the second cover and the corresponding one of the pair of heat storage elements.

12. The solid-state drive device according to claim 11, wherein a material of the inner frame has a lower thermal conductivity than a thermal conductivity of the pair of heat storage elements and the pair of covers.

13. The solid-state drive device according to claim 11, wherein the inner frame is configured to contact an edge of the pair of heat storage elements such that the inner frame maintains the spacing distance in a central area of the pair of heat storage elements.

14. The solid-state drive device according to claim 10, wherein the first heat storage element is configured to make a thermal contact with the second heat storage element in the portion through a thermal interface material (TIM).

15. The solid-state drive device according to claim 10, wherein the first heat storage element makes a thermal contact through the memory module and a thermal interface material (TIM).

16. The solid-state drive device according to claim 10, further comprising:
a bridge board having a socket and a first connector, the first connector configured to connect the memory module to an external device, and
a substrate having a second connector and at least one non-volatile memory device mounted thereto, the second connector configured to connect to the socket.

17. The solid-state drive device according to claim 16, further comprising:
a thermal spreader on the bridge board; and
an impact absorbing member between the thermal spreader and the second heat storage element.

18. A solid-state drive case comprising:
a pair of heat storage elements including a first heat storage element and a second heat storage element covering an upper part and a lower part of a memory module, respectively, the pair of heat storage elements configured to store heat emitted by the memory module, a first one of the pair of heat storage elements having at least a portion thereof connected to a second one of the pair of heat storage elements;
a pair of covers including a first cover and a second cover covering the first heat storage element and the second heat storage element, respectively, the pair of covers having an inner space therebetween housing the memory module and the pair of heat storage elements such that each of the pair of covers are separated from each of the pair of heat storage elements by a spacing distance; and
an inner frame in at least one of the first cover and the second cover and a corresponding one of the pair of heat storage elements, the inner frame configured to maintain the spacing distance between the first cover and the second cover and the corresponding one of the pair of heat storage elements.

19. The solid-state drive case according to claim 18, wherein
the pair of heat storage elements and the pair of covers are made of a same material having a first thermal conductivity, and
a material of the inner frame has a second thermal conductivity lower than the first thermal conductivity.

20. The solid-state drive case according to claim 18, wherein the first heat storage element makes a thermal contact with the second heat storage element in the portion through a thermal interface material (TIM).

* * * * *